(12) United States Patent
Matsukawa

(10) Patent No.: US 11,671,055 B2
(45) Date of Patent: Jun. 6, 2023

(54) OSCILLATOR

(71) Applicant: SEIKO EPSON CORPORATION, Tokyo (JP)

(72) Inventor: Norihito Matsukawa, Shimosuwa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/534,965

(22) Filed: Nov. 24, 2021

(65) Prior Publication Data

US 2022/0166383 A1 May 26, 2022

(30) Foreign Application Priority Data

Nov. 26, 2020 (JP) .............................. JP2020-195832

(51) Int. Cl.
| | |
|---|---|
| *H03B 5/04* | (2006.01) |
| *H03B 5/32* | (2006.01) |
| *H03L 1/04* | (2006.01) |
| *H03H 9/08* | (2006.01) |
| *H03L 1/02* | (2006.01) |

(52) U.S. Cl.
CPC ............... *H03B 5/323* (2013.01); *H03B 5/04* (2013.01); *H03B 5/32* (2013.01); *H03H 9/08* (2013.01); *H03L 1/028* (2013.01); *H03L 1/04* (2013.01); *H03B 2200/0018* (2013.01)

(58) Field of Classification Search
CPC ..... H01L 41/053; H01L 41/083; H01L 41/23; H03B 5/04; H03B 5/30; H03B 5/32; H03H 9/0538; H03H 9/0547; H03H 9/059; H03H 9/08; H03H 9/10; H03H 9/1021; H03L 1/02; H03L 1/028; H03L 1/04

See application file for complete search history.

(56) References Cited

U.S. PATENT DOCUMENTS

| | | | | |
|---|---|---|---|---|
| 6,731,180 | B1* | 5/2004 | Clark | H03L 1/04 310/341 |
| 2003/0197568 | A1* | 10/2003 | Satoh | H03B 5/36 331/158 |
| 2016/0285461 | A1* | 9/2016 | Okubo | H03L 1/00 |
| 2016/0285462 | A1* | 9/2016 | Takamuku | H03L 1/022 |
| 2016/0285463 | A1* | 9/2016 | Owaki | H03L 1/022 |
| 2017/0373637 | A1* | 12/2017 | Kondo | H03H 9/08 |
| 2018/0269832 | A1* | 9/2018 | Obata | H03B 5/04 |
| 2019/0267941 | A1* | 8/2019 | Obata | H03L 1/028 |
| 2020/0274487 | A1* | 8/2020 | Matsukawa | H03H 9/19 |
| 2020/0274512 | A1* | 8/2020 | Uehara | H03B 5/04 |

FOREIGN PATENT DOCUMENTS

JP 2017-130861 7/2017

* cited by examiner

*Primary Examiner* — Levi Gannon
(74) *Attorney, Agent, or Firm* — Rankin, Hill & Clark LLP

(57) ABSTRACT

There is configured an oscillator characterized by including an outer package having a housing space, an inner package housed in the housing space, a resonator element housed in the inner package, a heater element housed in the housing space, and fixed to the inner package, an oscillation circuit configured to oscillate the resonator element, a conducting member configured to electrically couple the inner package and the heater element to each other, and a first bonding wire configured to couple the heater element and the outer package to each other, and configured to electrically couple the conducting member and the outer package to each other.

15 Claims, 7 Drawing Sheets

OSCILLATOR

The present application is based on, and claims priority from JP Application Serial Number 2020-195832, filed Nov. 26, 2020, the disclosure of which is hereby incorporated by reference herein in its entirety.

BACKGROUND

1. Technical Field

The present disclosure relates to an oscillator.

2. Related Art

In the past, there has been known a technology of controlling the temperature in a package using a heater element housed in the package. In JP-A-2017-130861, there is disclosed a configuration in which a package body consisting of a heater package and a package of a TCXO is housed in a housing space formed of a base substrate and a cover case. In this configuration, the package body is mounted on the base substrate via a spacer.

In the related art described above, the spacer is provided with through holes as electrically-conducting paths, and the heat from the heater package mounted on the spacer is transferred to the base substrate, and is then radiated. In such a configuration, the heat from the outside of the base substrate is apt to be transferred to the heater package or the package of the TCXO via the through holes, and the characteristics of an oscillation signal are apt to be affected by the ambient temperature.

SUMMARY

In view of the problems described above, an oscillator as an embodiment of the present disclosure includes an outer package having a housing space, an inner package housed in the housing space, a resonator element housed in the inner package, a heater element housed in the housing space, and fixed to the inner package, an oscillation circuit configured to oscillate the resonator element, a conducting member configured to electrically couple the inner package and the heater element to each other, and at least one first bonding wire configured to couple the heater element and the outer package to each other, and configured to electrically couple the conducting member and the outer package to each other.

DESCRIPTION OF EXEMPLARY EMBODIMENTS

Hereinafter, some embodiments of an oscillator according to the present disclosure will be described.

First Embodiment

Figure 1:
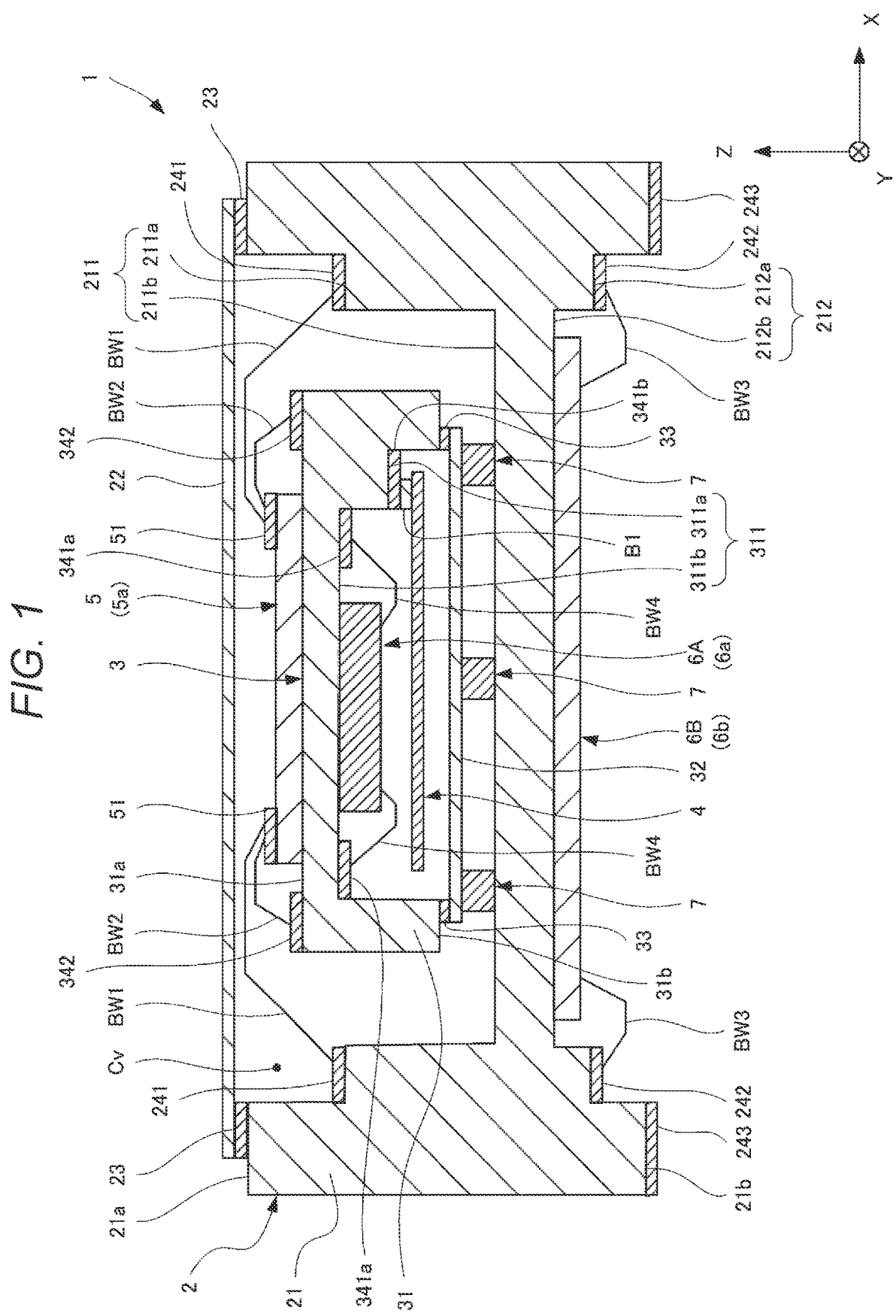
FIG. 1 is a cross-sectional view showing an oscillator according to a first embodiment.
Figure 2:
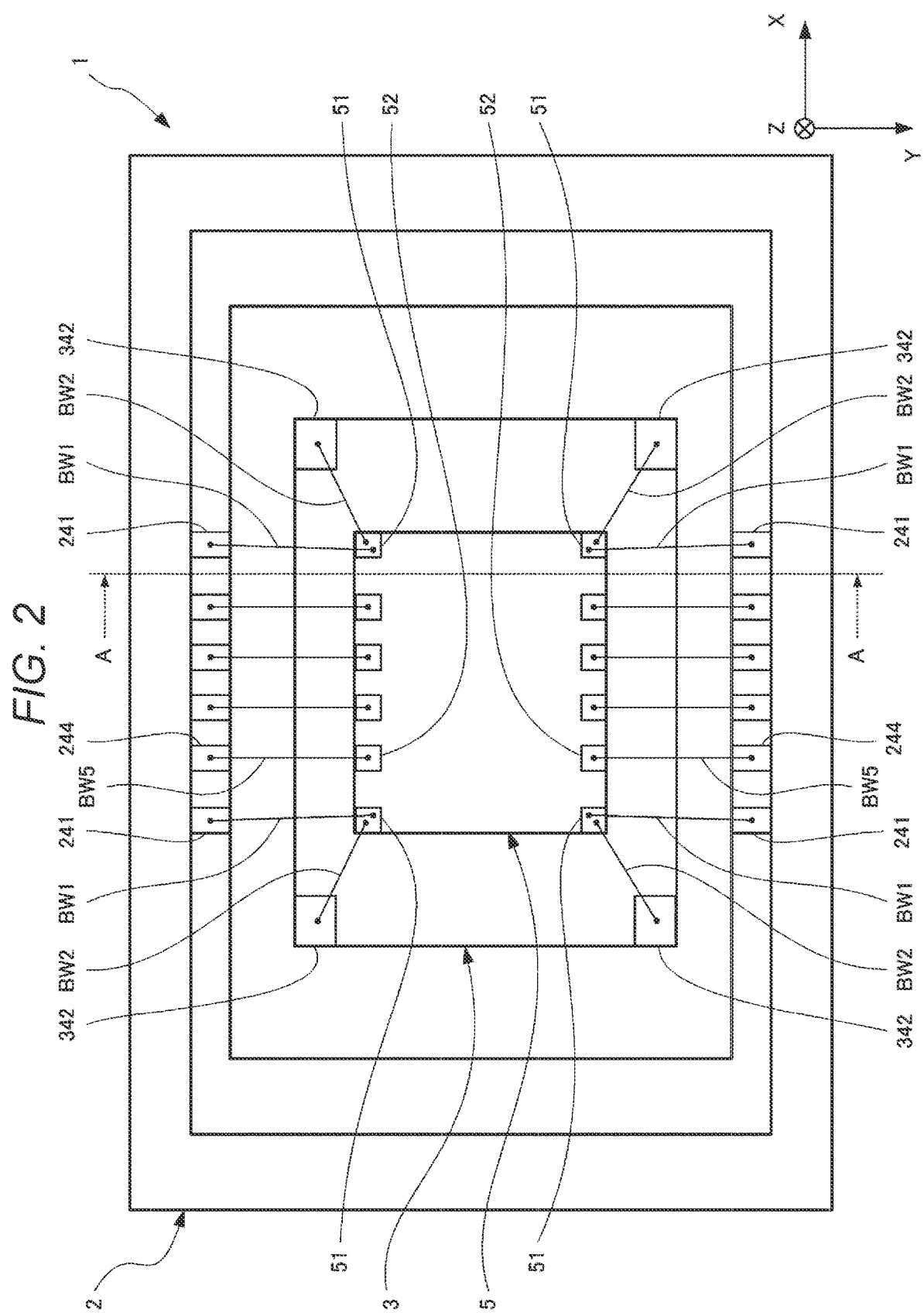
FIG. 2 is a plan view showing an inside of an outer package in the first embodiment.

FIG. 1 is a cross-sectional view showing an oscillator 1 according to a first embodiment. FIG. 2 is a plan view showing the oscillator 1 in a state in which a first lid 22 described later provided to the oscillator 1 shown in FIG. 1 is omitted. It should be noted that in each of the drawings, there are illustrated an X axis, a Y axis, and a Z axis perpendicular to each other for the sake of convenience of explanation. Further, a direction parallel to the X axis is referred to as an X-axis direction, a direction parallel to the Y axis is referred to as a Y-axis direction, and a direction parallel to the Z axis is referred to as a Z-axis direction. Further, the arrow side in the Z-axis direction is also referred to as an "upper side," and the opposite side thereof is also referred to as a "lower side." Further, a plan view viewed from the Z-axis direction is also referred to simply as a "plan view." FIG. 1 is a cross-sectional view along the line A-A shown in FIG. 2.

The oscillator 1 shown in FIG. 1 is an oven-controlled crystal oscillator (OCXO). The oscillator 1 is provided with an outer package 2 having a housing space Cv, an inner package 3 housed in the housing space Cv, and a resonator element 4 housed in the inner package 3. Further, the oscillator 1 is provided with a heater element 5 which is housed in the housing space Cv, and is fixed to the inner package 3, and an oscillation circuit 6A for oscillating the resonator element 4. In the present embodiment, the oscillation circuit 6A is provided with a circuit for oscillating the resonator element 4.

Further, the oscillator 1 is provided with second bonding wires BW2 as conducting members for electrically coupling the inner package 3 and the heater element 5 to each other, and first bonding wires BW1 which couple the heater element 5 and the outer package 2 to each other, and electrically couple the second bonding wires BW2 as the conducting members and the outer package 2 to each other. The oscillator 1 according to the present embodiment is capable of suppressing a frequency fluctuation of an oscillation signal by heating the resonator element 4 with the heat of the heater element 5 to keep the resonator element 4 at a desired temperature.

The outer package 2 has a first base substrate 21. The first base substrate 21 has an upper surface 21a and a lower surface 21b having an obverse-reverse relationship with each other. Further, the first base substrate 21 has a recessed part 211 which has a bottom, and opens in the upper surface 21a, and a recessed part 212 which has a bottom, and opens in the lower surface 21b. Therefore, the first base substrate 21 has an H-shaped cross-sectional shape. Further, the recessed part 211 is formed of a plurality of recessed parts, and has a recessed part 211a opening in the upper surface 21a, and a recessed part 211b which opens in a bottom surface of the recessed part 211a, and which is smaller in opening than the recessed part 211a. Further, the recessed part 212 is formed of a plurality of recessed parts, and has a recessed part 212a opening in the lower surface 21b, and a recessed part 212b which opens in a bottom surface of the recessed part 212a, and which is smaller in opening than the recessed part 212a. Further, the inner package 3 is fixed to a bottom surface of the recessed part 211b via heat-insulating members 7, and a circuit element 6B is fixed to a bottom surface of the recessed part 212b. In the present embodiment, the circuit element 6B is provided with a circuit including a temperature sensor (described later) for detecting the temperature, and a temperature control circuit for controlling the temperature of the heater element 5 based on the output of the temperature sensor.

Further, on the bottom surface of the recessed part 211a, there is disposed a plurality of pads 241, on the bottom surface of the recessed part 212a, there is disposed a plurality of pads 242, and on the lower surface 21b, there is disposed a plurality of mounting terminals 243. These pads 241, 242 and the mounting terminals 243 are electrically coupled via internal interconnections not shown formed inside the first base substrate 21. As described hereinafter, each of the pads 241 is electrically coupled to a pad of the heater element 5 via the first bonding wire BW1, and each of the pads 242 is electrically coupled to the circuit element 6B via a bonding wire BW3. Further, the oscillator 1 is electrically coupled to an external device not shown via the plurality of mounting terminals 243.

Further, the outer package 2 has a first lid 22. The first lid 22 is bonded to the upper surface 21a of the first base substrate 21 via a bonding member 23 to cover the opening of the recessed part 211. By covering the opening of the recessed part 211 with the first lid 22 in such a manner, the housing space Cv as an airtight space is formed inside the outer package 2. Further, the inner package 3 is housed in the housing space Cv.

The housing space Cv is in a reduced-pressure state, and preferably a state approximate to a vacuum state. Thus, it is possible to exert an excellent heat insulating property, and it becomes difficult for the heat outside the oscillator 1 to be transferred to the inner package 3. Therefore, the resonator element 4 becomes difficult to be affected by the external heat, and it becomes easy to keep the resonator element 4 at the desired temperature with the heat of the heater element 5. It should be noted that the atmosphere in the housing space Cv is not particularly limited, but can be an atmosphere filled with an inert gas such as nitrogen, argon, or helium, or can be in the atmospheric pressure state or a pressurized state instead of the reduced-pressure state. Further, it is possible for the housing space Cv to be filled with the heat-insulating member 7. It should be noted that the first base substrate 21 can be formed of ceramics such as alumina, and the first lid 22 can be formed of a metal material such as Kovar although not particularly limited.

The inner package 3 has a second base substrate 31. The second base substrate 31 has an upper surface 31a and a lower surface 31b having an obverse-reverse relationship with each other. Further, the second base substrate 31 has a recessed part 311 which has a bottom, and opens in the lower surface 31b. Further, the recessed part 311 is formed of a plurality of recessed parts, and has a recessed part 311a opening in the lower surface 31b, and a recessed part 311b which opens in a bottom surface of the recessed part 311a, and which is smaller in opening than the recessed part 311a. Further, the oscillation circuit 6A is fixed to a bottom surface of the recessed part 311b.

Further, on the bottom surface of the recessed part 311b, there is formed a plurality of pads 341a. The oscillation circuit 6A is electrically coupled to the pads 341a via bonding wires BW4. On the bottom surface of the recessed part 311a, there are formed pads 341b. The resonator element 4 is fixed to the pads 341b via bonding members B1 having electrical conductivity to thereby electrically coupled thereto. It should be noted that the bonding member B1 is not particularly limited providing the bonding member B1 has electrical conductivity, and it is possible to use, for example, a metal bump, solder, a metal paste, and an electrically-conductive adhesive as the bonding member B1.

On the upper surface 31a of the inner package 3, there is disposed a plurality pads 342. The pads 341a, 341b are electrically coupled to the pads 341 via internal interconnections not shown formed inside the second base substrate 31.

The inner package 3 has a second lid 32. The second lid 32 is bonded to the lower surface 31b of the second base substrate 31 via a bonding member 33 to cover the opening of the recessed part 311. By covering the opening of the recessed part 311 with the second lid 32 in such a manner, an airtight space is formed inside the inner package 3. The space is in a reduced-pressure state, and preferably a state approximate to a vacuum state. Thus, the CI (crystal impedance) value of the resonator element 4 decreases, and the oscillation characteristic is improved. It should be noted that the atmosphere is not particularly limited, but can also be, for example, in the atmospheric pressure state or a pressurized state. It should be noted that the second base substrate 31 can be formed of ceramics such as alumina, and the second lid 32 can be formed of a metal material such as Kovar although not particularly limited.

Such an inner package 3 is disposed in a posture in which the second lid 32 is directed toward the bottom surface of the recessed part 211b, and the second lid 32 is fixed to the bottom surface of the recessed part 211b via the heat-insulating members 7. By making the heat-insulating members 7 intervene between the inner package 3 and the outer package 2, the external heat such as the heat of the circuit element 6B becomes difficult to be transferred to the inner package 3 via the outer package 2. Therefore, the resonator element 4 becomes difficult to be affected by the external heat, and it becomes easy to keep the resonator element 4 at the desired temperature with the heat of the heater element 5. Further, conversely, the heat of the heater element 5 becomes difficult to be transferred to the outer package 2 via the inner package 3, and it is possible to efficiently transfer the heat of the heater element 5 to the resonator element 4. Therefore, it is possible to perform efficient drive of the heater element 5, and at the same time, it is possible to further stabilize the temperature of the resonator element 4.

In particular, the second lid 32 to which the resonator element 4 is not fixed out of the members constituting the inner package 3 is fixed to the outer package 2, and thus, it is possible to elongate the heat transfer path from the heat-insulating members 7 to the resonator element 4. Therefore, even when the external heat is transferred to the inner package 3 via the heat-insulating members 7, it becomes difficult for the heat to be transferred to the resonator element 4. Therefore, the resonator element 4 becomes more difficult to be affected by the external heat, and it becomes easy to keep the resonator element 4 at the desired temperature with the heat of the heater element 5. It should be noted that this is not a limitation, and it is possible for the second base substrate 31 to be fixed to the first base substrate 21 via the heat-insulating members 7.

The heat-insulating members 7 are each formed of a material lower in thermal conductivity than the second lid 32. The material of the heat-insulating members 7 described above is not particularly limited, and for example, a variety of resin materials such as a porous resin material such as porous polyimide can preferably be used as the material of the heat-insulating members 7, and besides the resin materials, a variety of glass materials, an inorganic porous material such as silica aerogel, and so on can be used as the material of the heat-insulating members 7. It should be noted that the thermal conductivity of the heat-insulating members 7 is not particularly limited, but is preferably no higher than 1.0 W/m·K. Thus, the heat-insulating members 7 sufficiently low in thermal conductivity are achieved.

Further, the heat-insulating members 7 are a plurality of columnar members arranged at a distance from each other, and are scattered so as to be spread in the entire area of the second lid 32. Thus, it is possible to fix the inner package 3 to the outer package 2 in a stable posture. Further, it is possible to reduce the contact area between the heat-insulating member 7 and the outer package 2, and thus, it becomes difficult for the external heat to be transferred to the inner package 3 via the heat-insulating members 7. It should be noted that this is not a limitation, and it is possible for the heat-insulating members 7 to be disposed so as to be spread in the entire area of the lower surface of the second lid 32. Thus, the bonding area between the inner package 3 and the outer package 2 increases, and thus, the bonding strength increases. Therefore, the mechanical strength of the oscillator 1 increases.

It should be noted that when the heat-insulating members 7 have an adhesion force, it is sufficient to bond the second lid 32 and the first base substrate 21 to each other via the heat-insulating members 7. In contrast, when the heat-insulating members 7 do not have an adhesion force, it is sufficient to bond the heat-insulating members 7 and the second lid 32, and the heat-insulating members 7 and the first base substrate 21 to each other via bonding members, respectively. Further, it is possible for the heat-insulating members 7 to include a gap material sufficiently low in thermal conductivity such as silica gel. Thus, it is possible to control the thickness of the heat-insulating members 7, and thus, it is possible to more surely exert the heat-insulating effect.

In the present embodiment, the heat-insulating members 7 are each an insulating body, and a conductive member such as a through hole is not provided to the surfaces and the inside of the heat-insulating members 7. Therefore, the second lid 32 and the recessed part 211b are not electrically coupled to each other, and it becomes difficult for the heat to be transferred through the surfaces and the inside of the heat-insulating members 7.

The resonator element 4 according to the present embodiment is an SC-cut quartz crystal resonator element. The shape of the quartz crystal resonator is not particularly limited, and for example, it is possible for the planar shape of the quartz crystal substrate to be a circular shape or a rectangular shape. Further, the resonator element 4 can be a piezoelectric resonator element such as an AT-cut quartz crystal resonator element, a BT-cut quartz crystal resonator element, a tuning-fork quartz crystal resonator element, or a surface acoustic wave resonator, a MEMS (Micro Electro Mechanical Systems) resonator element, or the like.

In the present embodiment, the heater element 5 is fixed to the upper surface 31a of the inner package 3. Therefore, in the present embodiment, the inner package 3 is fixed to the outer package 2, and the heater element 5 is fixed to an opposite side (the upper surface 31a) to the surface of the outer package 2 to which the inner package 3 is fixed. According to this configuration, it becomes difficult for the heat generated in the heater element 5 to be transferred to the outer package 2, and it becomes possible to easily control the temperature of the resonator element 4 using the heater element 5.

In the present embodiment, the heater element 5 is an integrated circuit, and has a heat-generating circuit not shown having a function as a heat-generating section for heating the resonator element 4, and a temperature sensor 5a. On an upper surface of the heater element 5, there is disposed a plurality of pads 52 as shown in FIG. 2. On the bottom surface of the recessed part 211a of the outer package 2, there are formed pads 244, and the pads 52 of the heater element 5 are electrically coupled to the pads 244 of the outer package 2 via bonding wires BW5, respectively. It should be noted that in FIG. 2, there are shown just two sets of combination of the pads 52, 244, and the bonding wire BW5.

Each of the pads 52 is electrically coupled to the heat-generating circuit or the temperature sensor 5a provided to the heater element 5. Further, the pads 244 are electrically coupled to the pads 242 via internal interconnections not shown formed inside the first base substrate 21. In other words, the heater element 5 is coupled to the circuit element 6B via these pads 52, 244 and the bonding wires BW5.

Using the pads and the bonding described hereinabove, the resonator element 4 and the oscillation circuit 6A are electrically coupled to each other, and the oscillation circuit 6A and the circuit element 6B are electrically coupled to each other. Further, the heater element 5 and the circuit element 6B are electrically coupled to each other. Due to such electrical coupling, the oscillator 1 functions as an oven-controlled crystal oscillator (OCXO). Specifically, the oscillation circuit 6A oscillates the resonator element 4, and the circuit element 6B outputs the oscillation signal from the mounting terminal 243.

The temperature control circuit of the circuit element 6B operates so as to control an amount of a current flowing through a resistor of the heat-generating circuit based on an output signal of the temperature sensor 5a provided to the heater element 5, or a temperature sensor 6a provided to the oscillation circuit 6A to keep the resonator element 4 at a constant temperature. For example, when the current temperature determined based on the output signal of the temperature sensor 5a is lower than a predetermined reference temperature, the temperature control circuit of the circuit element 6B makes the current flow through the resistor of the heat-generating circuit. When the current temperature is higher than the reference temperature, the temperature control circuit of the circuit element 6B controls the current not to flow through the resistor of the heat-generating circuit. Further, for example, it is possible for the temperature control circuit to perform the control so as to increase or decrease the amount of the current flowing through the resistor of the heat-generating circuit in accordance with a difference between the current temperature and the reference temperature.

The oscillator 1 according to the present embodiment is further provided with a function of performing temperature compensation. Specifically, the oscillation circuit 6A has a function of oscillating the resonator element 4 to generate the oscillation signal which is temperature-compensated based on the detection temperature of the temperature sensor 6a provided to the oscillation circuit 6A, the temperature sensor 6b provided to the circuit element 6B, or both of the temperature sensors 6a, 6b. Specifically, the oscillation circuit 6A has an oscillation circuit section which is electrically coupled to the resonator element 4, amplifies the output signal of the resonator element 4, and feeds the signal thus amplified back to the resonator element 4 to thereby oscillate the resonator element 4, and a temperature compensation circuit section for performing the temperature compensation so that the frequency fluctuation of the oscillation signal becomes smaller than the frequency-temperature characteristics of the resonator element 4 itself based on temperature information output from one or both of the temperature sensors 6a, 6b.

In the present embodiment having such a configuration as described hereinabove, the second bonding wires BW2 are coupled to the pads 342 provided to the inner package 3 and the pads 51 provided to the heater element 5. Therefore, the second bonding wires BW2 each function as a conducting member for electrically coupling the inner package 3 and the heater element 5 to each other.

Further, in the present embodiment, as shown in FIG. 2, the first bonding wires BW1 are coupled to the pads 241 provided to the outer package 2 and the pads 51 provided to the heater element 5. Therefore, the first bonding wires BW1 electrically couple the heater element 5 and the outer package 2 to each other. Further, the first bonding wires BW1 and the second bonding wires BW2 are both coupled to the pads 51, respectively. Therefore, the second bonding wires BW2 as the conducting members and the outer package 2 are electrically coupled to each other via the first bonding wires BW1, respectively.

Further, in the present embodiment, the inner package 3 is fixed to the recessed part 211b via the heat-insulating members 7, and other parts of the inner package 3 do not have contact with the outer package 2. Therefore, the major transfer of the heat between the inner package 3 and the outer package 2 is limited to the transfer via the heat-insulating members 7, and the transfer via the first bonding wires BW1 and the second bonding wires BW2.

Since the heat-insulating members 7 are made of a material sufficiently low in thermal conductivity, the transfer of the heat can be neglected. In contrast, the first bonding wires BW1 and the second bonding wires BW2 are thermally coupled to the outer package 2, the inner package 3, and the heater element 5. However, the inner package 3 and the outer package 2 are not coupled to each other with single bonding wires, but are thermally coupled to each other indirectly via the second bonding wires BW2, the pads 51, and the first bonding wires BW1. Therefore, the length of the thermal transfer path between the inner package 3 and the outer package 2 becomes long, and further, the thermal resistance also becomes high. Therefore, the heat transfer between the inner package 3 and the outer package 2 is difficult to occur.

Further, when the oscillator 1 operates, the temperature adjustment of the resonator element 4 located inside the inner package 3 is performed by generating the heat with the heater element 5. Therefore, the direction of the major heat transfer is a direction from the pads 51 of the heater element 5 toward the outer package 2, or a direction from the pads 51 of the heater element 5 toward the inner package 3. Therefore, the heat transfer from the inner package 3 toward the outer package 2, and the heat transfer from the outer package 2 toward the inner package 3 are difficult to occur. Therefore, the resonator element 4 becomes difficult to be affected by the external heat, and it becomes easy to keep the resonator element 4 at the desired temperature with the heat of the heater element 5. Further, it becomes difficult for the heat of the heater element 5 to be transferred to the outer package 2 via the inner package 3.

Further, as the heat transfer path from the heater element 5 to the inner package 3, there exist the second bonding wires BW2 in addition to the portion where the heater element 5 and the inner package 3 actually have contact with each other. Therefore, in the state of the plan view of the inner package 3, it is possible to transfer the heat to a plurality of portions other than the portion where the heater element 5 and the inner package 3 actually have contact with each other, and it is possible to evenly heat the inner package 3. Therefore, it is possible to efficiently transfer the heat of the heater element 5 to the resonator element 4, and thus, it is possible to perform the efficient drive of the heater element 5, and at the same time, it is possible to further stabilize the temperature of the resonator element 4.

It should be noted that as shown in FIG. 1, the circuit element 6B is disposed inside the recessed part 212 of the first base substrate 21, and is fixed to the bottom surface of the recessed part 212. In other words, the circuit element 6B is located outside the housing space Cv. Thus, it becomes difficult for the heat generated in the circuit element 6B to be transferred to the inner package 3. Therefore, the resonator element 4 becomes difficult to be affected by the heat of the circuit element 6B, and it becomes easy to keep the resonator element 4 at the desired temperature with the heat of the heater element 5. Further, since it is possible to disposed the inner package 3 and the circuit element 6B so as to overlap each other in the Z-axis direction, the spread of the oscillator 1 in the X-axis direction and the Y-axis direction is prevented, and thus, it is possible to achieve reduction in size of the oscillator 1.

Second Embodiment

The first embodiment is illustrative only, and a variety of embodiments can be adopted besides the first embodiment. For example, it is sufficient for the second bonding wires BW2 to be disposed so as to couple the inner package 3 and the heater element 5 to each other instead of directly coupling the inner package 3 and the outer package 2 to each other. Therefore, the number of the second bonding wires BW2 is not limited.

Figure 3:
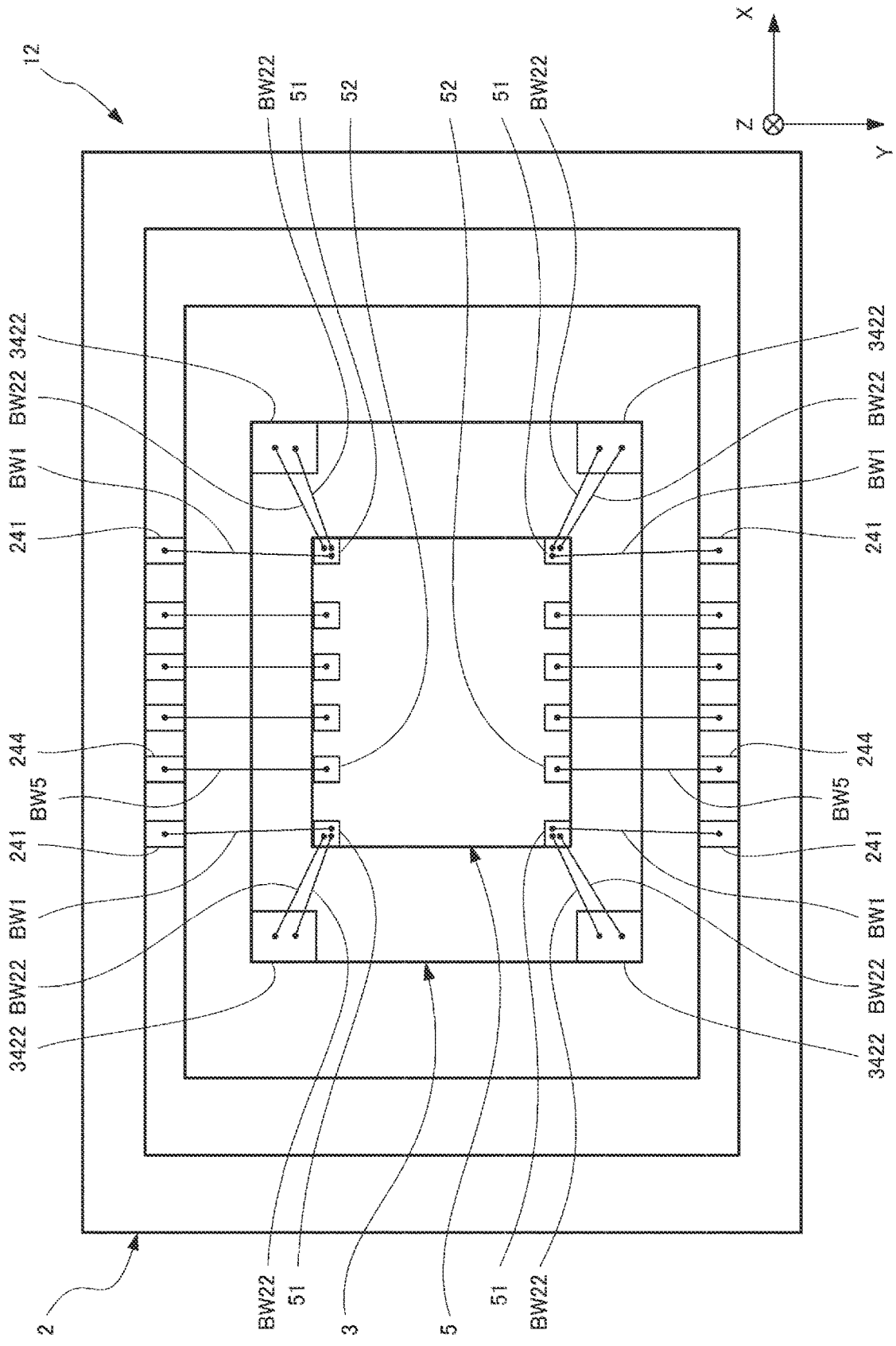
FIG. 3 is a plan view showing an inside of an outer package in a second embodiment.

FIG. 3 is a plan view showing an oscillator 12 according to a second embodiment. The oscillator 12 according to the second embodiment has substantially the same configuration as in the first embodiment except the point that the number of the second bonding wires is different, and the point that pads 3422 are larger. In FIG. 3, the constituents substantially the same as those of the first embodiment are denoted by the same reference symbols as those shown in FIG. 2. Further, similarly to FIG. 2, FIG. 3 is a plan view showing the oscillator 12 in a state in which the first lid 22 is omitted.

In the second embodiment, two second bonding wires BW22 are formed for a set of the pads 51, 3422. Specifically, one end portions of the two second bonding wires BW22 are coupled to each of the pads 3422 provided to the inner package 3, and the other end portions of the two second bonding wires BW22 are coupled to each of the pads 51 provided to the heater element 5. In the example shown in FIG. 3, since the pads 3422 are located on four corners of the inner package 3, and the pads 51 are located on four corners of the heater element 5, the total number of the second bonding wires BW22 is eight. As described above, in the present embodiment, the number of the first bonding wires BW1 is made smaller than the number of the second bonding wires BW22.

As described hereinabove, when the number of the second bonding wires BW22 increases, the heat transfer paths between the heater element 5 and the inner package 3 increase, and at the same time, are scattered. Further, the pads 3422 each has a rectangular shape similarly to the pads 342 in the first embodiment, but are each larger than the pad 342. Therefore, it is possible to distribute the junctions between the second bonding wires BW22 and the inner package 3 over a broader range of the inner package 3 compared to the first embodiment. According to the configuration described hereinabove, it is possible to evenly heat the inner package 3 with the heater element 5. Therefore, it is possible to efficiently transfer the heat of the heater element 5 to the resonator element 4, and thus, it is possible to perform the efficient drive of the heater element 5, and at the same time, it is possible to further stabilize the temperature of the resonator element 4.

It should be noted that the configuration in which the two second bonding wires BW22 are used every set of pads is not a limitation, and the number of the second bonding wires BW22 can be three or more, or just one for at least one set of pads. Further, the sizes, the positions, and the shapes of the pads 3422, 51 are not limited to those in the aspects of the first embodiment and the second embodiment. Therefore, a larger or smaller pad can be formed in at least one of the inner package 3 and the heater element 5, the pad can be formed at a position different from at least one of the four corners, or the shape can be different.

Third Embodiment

Figure 4:
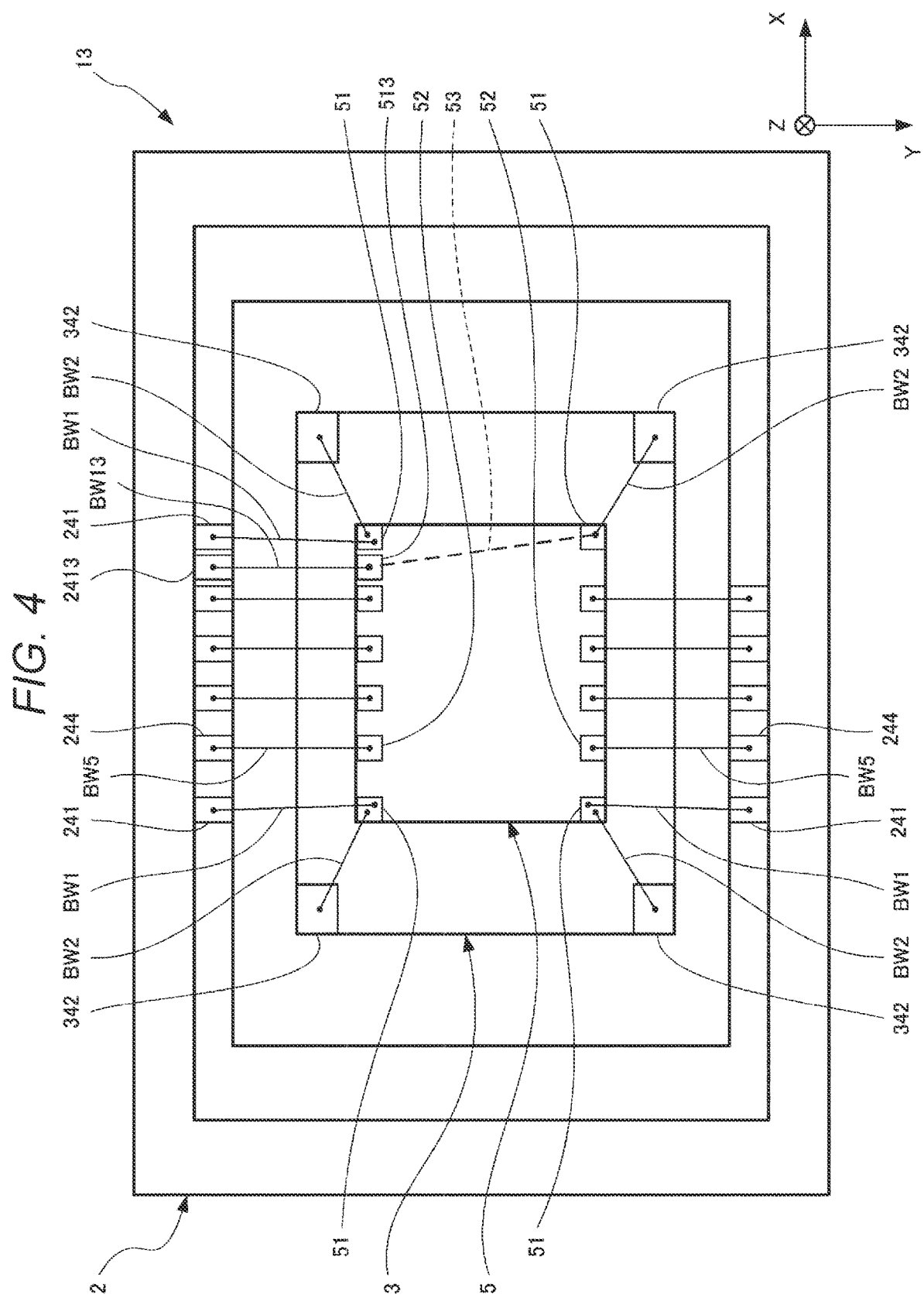
FIG. 4 is a plan view showing an inside of an outer package in a third embodiment.

The aspect of the first bonding wires BW1 is not limited to the aspect in the first embodiment. For example, it is not required to adopt the configuration in which the first bonding wires BW1 and the second bonding wires BW2 are disposed adjacent to each other. FIG. 4 is a plan view showing an oscillator 13 according to a third embodiment. The oscillator 13 according to the third embodiment has substantially the same configuration as in the first embodiment except the point that the configuration of the first bonding wires for electrically coupling the second bonding wires to the outer package 2 via the heater element 5 is partially different, and a relay interconnection 53 exists inside the heater element 5. In FIG. 4, the constituents substantially the same as those of the first embodiment are denoted by the same reference symbols as those shown in FIG. 2. Further, similarly to FIG. 2, FIG. 4 is a plan view showing the oscillator 13 in a state in which the first lid 22 is omitted.

In the third embodiment, the pads 342 formed on the four corners of the inner package 3 and the pads 51 formed on the four corners of the heater element 5 are coupled to each other with the second bonding wires BW2, respectively. However, the first bonding wires BW1 extend from the three corners of the heater element 5 to the pads 241 of the outer package 2 similarly to the first embodiment on the one hand, but the first bonding wire BW1 does not extend from the pad 51 formed on the one corner (the lower right corner in FIG. 4) of the heater element 5 on the other hand.

Instead, the pad 51 is coupled to a pad 513 via the relay interconnection 53 formed inside the heater element 5. Specifically, in the third embodiment, the pad 513 is formed at a position along the upper side in FIG. 4 of the heater element 5 which is different from the position of the pad 51 located on the lower right corner in FIG. 4, and the pads 51, 513 are electrically coupled to each other with the relay interconnection.

Further, the pad 513 is electrically coupled to a pad 2413 provided to the outer package 2 via the first bonding wire BW13. According to the configuration described hereinabove, it is possible to electrically couple the heater element 5 and the outer package 2 to each other with the first bonding wire BW13 using the pad 513 formed at the position different from the position of the second bonding wire BW2 for coupling the inner package 3 and the heater element 5 to each other.

Therefore, the degree of freedom of the arrangement of the first bonding wire BW13 for electrically coupling the inner package 3 and the outer package 2 to each other increases. Therefore, while deciding the positions of the second bonding wires BW2 forming the heat transfer paths between the inner package 3 and the heater element 5 from a viewpoint of the distributed arrangement of the heat transfer paths on the upper surface of the inner package 3 and so on, it is possible to decide the arrangement of the first bonding wire BW13 from a different viewpoint.

For example, the pad 2413 electrically coupled to the first bonding wire BW13 is further coupled to the internal interconnection of the outer package 2 to be coupled to the mounting terminal 243. The shorter the internal interconnection is, and the more difficult for the internal interconnection to form a loop, the more difficult for the internal interconnection to generate a parasitic capacitance, and more difficult for the internal interconnection to generate noise. Therefore, when the degree of freedom of the arrangement of the first bonding wire BW13 is high, it becomes easy to select the arrangement difficult to generate the noise.

Meanwhile, the arrangement of the second bonding wires BW2 can be decided without the restriction of the arrangement of the first bonding wire BW13. Therefore, also in the third embodiment, it is possible to evenly heat the inner package 3 with the heater element 5 similarly to the first embodiment. Therefore, it is possible to efficiently transfer the heat of the heater element 5 to the resonator element 4, and thus, it is possible to perform the efficient drive of the heater element 5, and at the same time, it is possible to further stabilize the temperature of the resonator element 4.

It should be noted that the configuration in which the number of the first bonding wires BW13 to be electrically coupled to the relay interconnections is one is not a limitation, and an arbitrary number of first bonding wires can be coupled to the pads 51 and the second bonding wires via the respective relay interconnections.

Fourth Embodiment

It is sufficient for the second bonding wires BW2 to be the conducting members for electrically coupling the inner package and the heater element to each other, and it is possible to adopt a variety of configurations capable of electrically coupling the both parties. For example, the conducting member can be an electrically-conductive bonding member. In other words, it is possible to adopt a configuration in which the inner package and the heater element are bonded to each other via the electrically-conductive bonding members.

Figure 5:
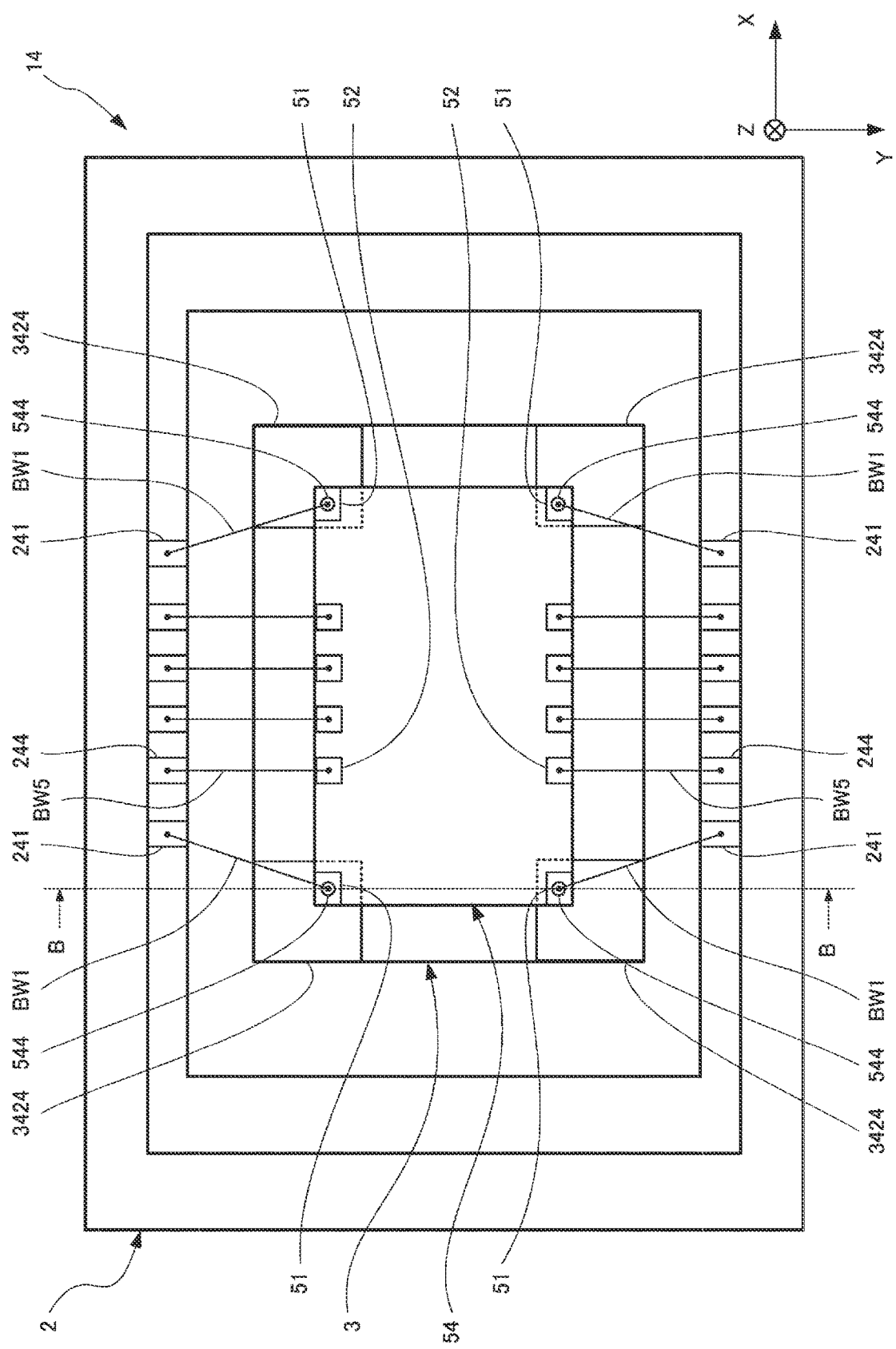
FIG. 5 is a plan view showing an inside of an outer package in a fourth embodiment.

FIG. 5 is a plan view showing an oscillator 14 according to a fourth embodiment. The oscillator 14 according to the fourth embodiment has substantially the same configuration as in the first embodiment except the point that the configuration for electrically coupling the inner package and the heater element to each other is different, and the sizes of the pads provided to the inner package, and the heater element are different. In FIG. 5, the constituents substantially the same as those of the first embodiment are denoted by the same reference symbols as those shown in FIG. 2. Further, similarly to FIG. 2, FIG. 5 is a plan view showing the oscillator 14 in a state in which the first lid 22 is omitted.

In the fourth embodiment, the size in the horizontal direction in the drawing (the X-axis direction) of a heater element 54 is larger, and the size of the pads 3424 formed on the upper surface of the inner package 3 is larger compared to the first embodiment. Therefore, in the plan view, the four corners of the heater element 54 and the pads 3424 overlap each other, respectively. Therefore, in the fourth embodiment, the heater element 54 is provided with through electrodes 544 as via interconnections, and the through electrodes 544 function as the conducting members for electrically coupling the inner package 3 and the heater element 54 to each other.

Figure 6:
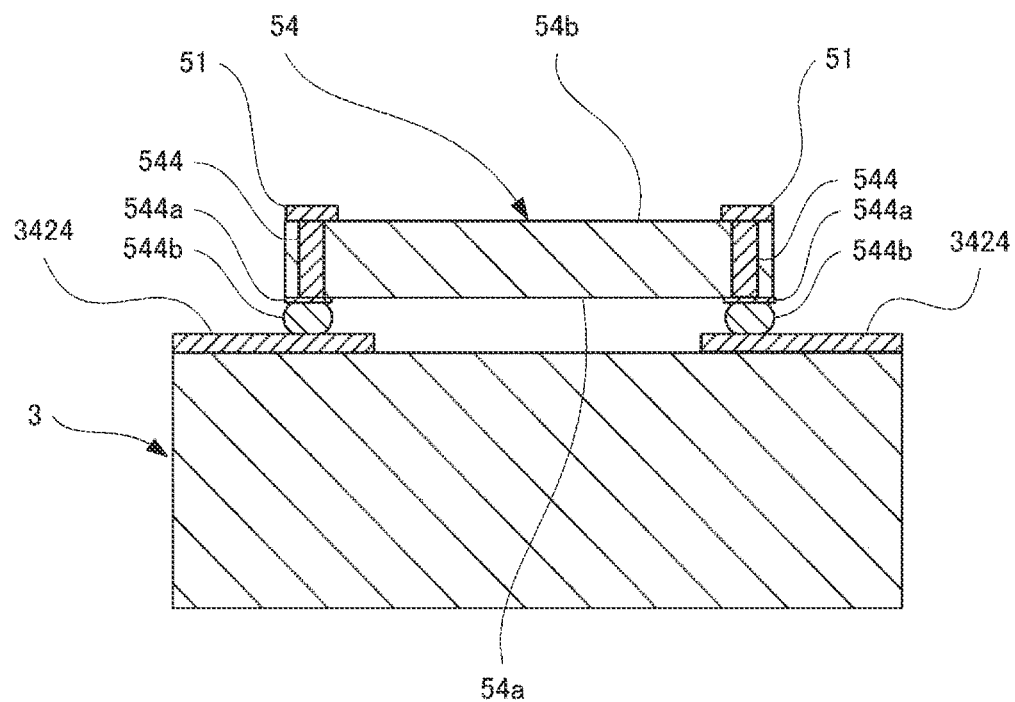
FIG. 6 is a cross-sectional view showing an inner package and a heater element in the fourth embodiment.

Specifically, also in the fourth embodiment, the heater element 54 is the integrated circuit, and the through electrodes 544 are formed inside the integrated circuit. FIG. 6 shows a cross-sectional surface along the line B-B in FIG. 5. A schematic shape of the heater element 54 is a rectangular solid shape, and a lower surface shown in FIG. 6 is referred to as a first surface 54a, and a surface which has an obverse-reverse relationship with the first surface 54a, and is provided with the pads 51 to which the first bonding wires BW1 are coupled is referred to as a second surface 54b. The through electrodes 544 are each electrically coupled to the pad 51 at the second surface 54b side, and are each electrically coupled to the pad 544a at the first surface 54a side.

The pads 544a disposed on the first surface 54a are each electrically coupled to the pad 3424 provided to the inner package 3 via a bump 544b as the electrically-conductive bonding member. It should be noted that the bumps 544b can be formed of, for example, solder or gold. According to the configuration described hereinabove, the inner package 3 and the heater element 5 are electrically coupled to each other via the bumps 544b and the through electrodes 544. Further, as shown in FIG. 5, since the first bonding wires BW1 are coupled to the pads 51, the inner package 3 is electrically and thermally coupled to the outer package 2 via the first bonding wires BW1.

In such a fourth embodiment, even in the configuration in which the pads 3424 of the inner package 3 are located immediately below the heater element 54, it is possible to electrically and thermally couple the inner package 3 and the heater element 5 to each other. Therefore, even when the size of the heater element 54 is large, it is possible to electrically and thermally couple the inner package 3 and the heater element 5 to each other. Therefore, also in the fourth embodiment, it is possible to evenly heat the inner package 3 with the heater element 54 similarly to the first embodiment. Therefore, it is possible to efficiently transfer the heat of the heater element 54 to the resonator element 4, and thus, it is possible to perform the efficient drive of the heater element 54, and at the same time, it is possible to further stabilize the temperature of the resonator element 4.

It should be noted that the number of the positions where the pads 3424 and the heater element 54 are coupled to each other using the through electrodes 544 is not limited to four, and can be smaller than four, or can also be larger than four. In the former case, it is possible to use both of the second bonding wires BW2 and the through electrodes 544. Further, the interconnections disposed inside the heater element 5 are not limited to the through electrodes 544. For example, a via interconnection can be adopted, and besides the interconnections formed linearly from the first surface 54a toward the second surface 54b inside the heater element 54, it is possible to form an interconnection so as to be laid around in a direction parallel to the first surface 54a or the second surface 54b in a plurality of layers in the heater element 54.

Fifth Embodiment

The aspect of the outer package, the inner package, and the heater element is not limited to those in the embodiments described above. For example, the shapes of the outer package, the inner package, and the heater element are not limited to those in the embodiments described above. Further, the relationship between the inner package and the heater element is not limited to those in the embodiments described above. For example, it is possible to adopt a configuration in which the heater element is fixed to the outer package, the inner package is fixed to an opposite side to the surface of the outer package to which the heater element is fixed.

Figure 7:
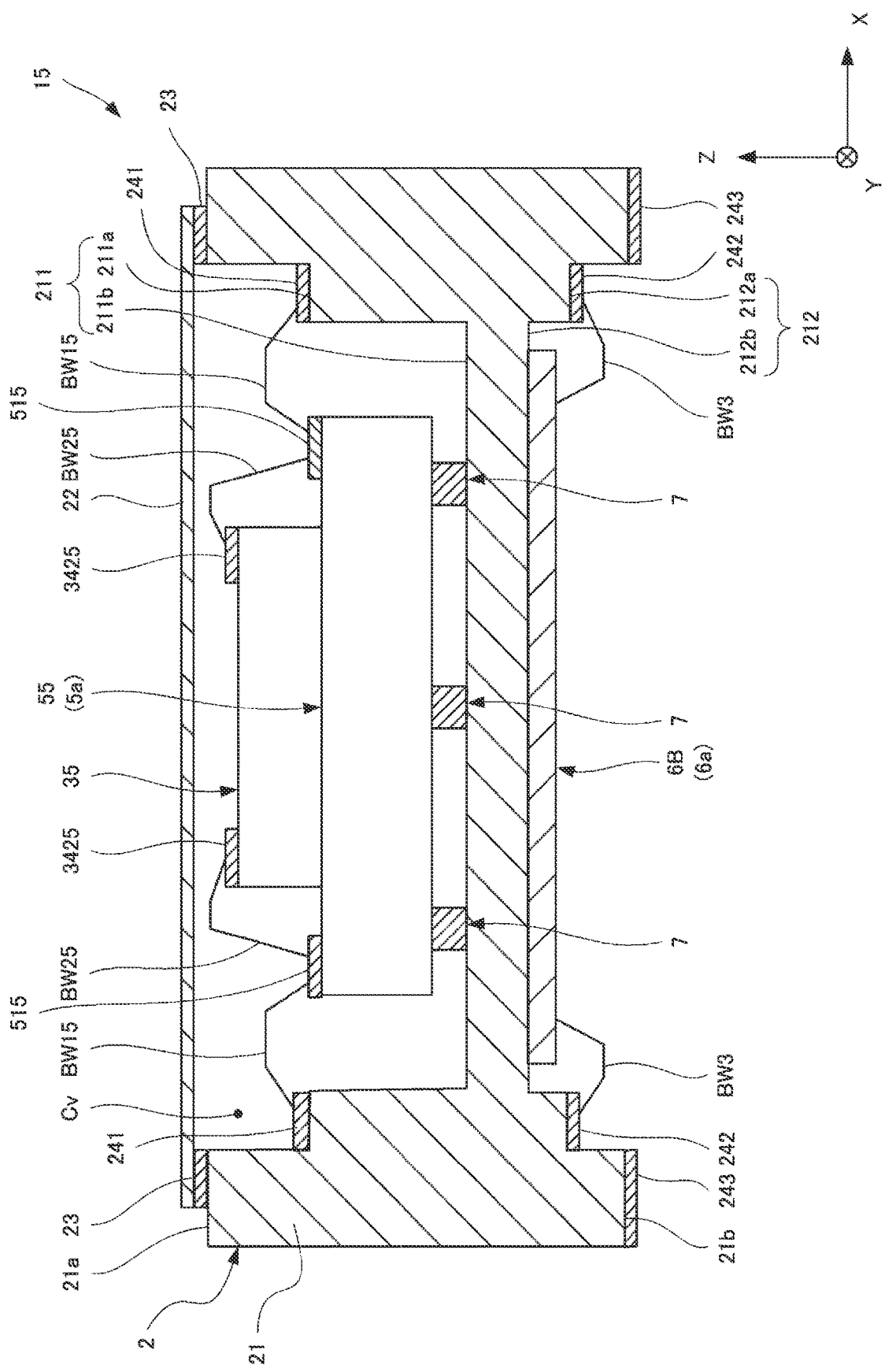
FIG. 7 is a cross-sectional view showing an oscillator according to a fifth embodiment.

FIG. 7 is a cross-sectional view showing an oscillator 15 according to a fifth embodiment. The oscillator 15 according to the fifth embodiment has substantially the same configuration as in the first embodiment except the point that the sizes of, and the positional relationship between, the inner package and the heater element are different, and the configuration for electrically coupling the inner package, the heater element, and the outer package to each other is different due to the positional relationship. In FIG. 7, the constituents substantially the same as those of the first embodiment are denoted by the same reference symbols as those shown in FIG. 1. Further, in FIG. 7, the internal configurations of the inner package and the heater element are omitted.

As shown in FIG. 7, in the fifth embodiment, a heater element 55 is fixed to the recessed part 211b of the outer package 2 via the heat-insulating members 7. An inner package 35 is fixed to an upper surface of the heater element 55. On the upper surface of the inner package 35, there are disposed pads 3425, and on the upper surface of the heater element 55, there are disposed pads 515.

The pads 3425 and the pads 515 are coupled to each other via second bonding wires BW25, respectively. Therefore, the inner package 35 and the heater element 55 are electrically coupled to each other with the second bonding wires BW25. Further, the pads 3425 and the pads 241 provided to the outer package 2 are coupled to each other via first bonding wires BW15, respectively. Therefore, the heater element 55 and the outer package 2 are electrically coupled to each other with the first bonding wires BW15.

According to the configuration described hereinabove, the inner package 35 is electrically, and thermally coupled to the outer package 2 via the pads 3425, the second bonding wires BW25, the pads 515, the first bonding wires BW15, and the pads 241. Therefore, the inner package 35 is coupled to the outer package 2 with the heater element 55 as an intermediate, but is not directly coupled to the outer package 2. Therefore, also in the fifth embodiment, it is possible to evenly heat the inner package with the heater element 55 similarly to the first embodiment. Therefore, it is possible to efficiently transfer the heat of the heater element 55 to the resonator element located inside the inner package 35, and thus, it is possible to perform the efficient drive of the heater element 55, and at the same time, it is possible to further stabilize the temperature of the resonator element.

OTHER EMBODIMENTS

The embodiments described above are each an example for implementing the present disclosure, and a variety of embodiments can be adopted besides the above. For example, the number of the inner packages and the number of the heater elements in the outer package are not limited to one. Specifically, it is possible for the outer package to house a plurality of pairs of the inner package and the heater element fixed to the upper surface of the inner package. Further, it is possible for the outer package to house a plurality of pairs of the heater element and the inner package fixed to the upper surface of the heater element. Further, it is possible to adopt a configuration in which a plurality of heater elements is fixed to the upper surface of such an inner package as in the first embodiment. Further, it is possible to adopt a configuration in which a plurality of inner packages is fixed to the upper surface of such a heater element as in the fifth embodiment. Also in these cases, the inner package and the outer package are not directly coupled to each other with the conducting members, but the inner package and the heater element are coupled to each other with the conducting members. According to this configuration, the inner package and the outer package are configured so as to indirectly be coupled to each other.

Further, the configuration in which all of the electrical couplings between the inner package and the outer package are relayed by the heater element is not a limitation. For example, when there is a plurality of electrical couplings between the inner package and the outer package, and at least one of the electrical couplings between the inner package and the outer package is relayed by the heater element, it is possible to suppress the heat transfer in that portion.

The embodiments described hereinabove are each an example of implementing the present disclosure. Therefore, the configuration of each section can be replaced with an arbitrary configuration having substantially the same function. Further, the present disclosure can also be added with any other constituents. Further, it is also possible to arbitrarily combine any of the embodiments described above with each other.

What is claimed is:
1. An oscillator comprising:
an outer package having a housing space;
an inner package housed in the housing space, the inner package fixed to the outer package via a heat-insulating member;
a resonator element housed in the inner package;
a heater element housed in the housing space, and fixed to the inner package;
an oscillation circuit housed in the inner package and configured to oscillate the resonator element;
a conducting member configured to electrically couple the inner package and the heater element to each other; and
at least one first bonding wire configured to couple the heater element and the outer package to each other, and configured to electrically couple the conducting member and the outer package to each other.

2. The oscillator according to claim 1, wherein
the heater element has a relay interconnection configured to electrically couple the conducting member and the first bonding wire to each other.

3. The oscillator according to claim 1, wherein
the conducting member is an electrically-conductive bonding member, and the inner package and the heater element are bonded to each other via the electrically-conductive bonding member.

4. The oscillator according to claim 1, wherein
the inner package is fixed to the outer package, and the heater element is fixed to an opposite side to a surface of the outer package to which the inner package is fixed.

5. The oscillator according to claim 1, wherein
the heater element is fixed to the outer package, and the inner package is fixed to an opposite side to a surface of the outer package to which the heater element is fixed.

6. An oscillator comprising:
an outer package having a housing space;
an inner package housed in the housing space;
a resonator element housed in the inner package;
a heater element housed in the housing space, and fixed to the inner package;
an oscillation circuit configured to oscillate the resonator element;
a conducting member configured to electrically couple the inner package and the heater element to each other; and
at least one first bonding wire configured to couple the heater element and the outer package to each other, and configured to electrically couple the conducting member and the outer package to each other, wherein
the conducting member is at least one second bonding wire, and
a number of the first bonding wires is smaller than a number of the second bonding wires.

7. The oscillator according to claim 6, wherein
the inner package is fixed to the outer package via a heat-insulating member.

8. The oscillator according to claim 6, wherein
the heater element has a relay interconnection configured to electrically couple the conducting member and the first bonding wire to each other.

9. The oscillator according to claim 6, wherein
the inner package is fixed to the outer package, and the heater element is fixed to an opposite side to a surface of the outer package to which the inner package is fixed.

10. The oscillator according to claim 6, wherein
the heater element is fixed to the outer package, and the inner package is fixed to an opposite side to a surface of the outer package to which the heater element is fixed.

11. An oscillator comprising:
an outer package having a housing space;
an inner package housed in the housing space;
a resonator element housed in the inner package;
a heater element housed in the housing space, and fixed to the inner package;
an oscillation circuit configured to oscillate the resonator element;
a conducting member configured to electrically couple the inner package and the heater element to each other; and
at least one first bonding wire configured to couple the heater element and the outer package to each other, and configured to electrically couple the conducting member and the outer package to each other, wherein
the conducting member is an electrically-conductive bonding member,
the inner package and the heater element are bonded to each other via the electrically-conductive bonding member,
the heater element is an integrated circuit, and includes
a first surface to be bonded to the electrically-conductive bonding member, a second surface having an obverse-reverse relationship with the first surface, and is provided with a pad to which the first bonding wire is coupled, and a via interconnection configured to electrically couple the electrically-conductive bonding member and the pad to each other.

12. The oscillator according to claim 11, wherein the inner package is fixed to the outer package via a heat-insulating member.

13. The oscillator according to claim 11, wherein the heater element has a relay interconnection configured to electrically couple the conducting member and the first bonding wire to each other.

14. The oscillator according to claim 11, wherein the inner package is fixed to the outer package, and the heater element is fixed to an opposite side to a surface of the outer package to which the inner package is fixed.

15. The oscillator according to claim 11, wherein the heater element is fixed to the outer package, and the inner package is fixed to an opposite side to a surface of the outer package to which the heater element is fixed.

\* \* \* \* \*